(12) United States Patent
Farrar et al.

(10) Patent No.: US 6,784,550 B2
(45) Date of Patent: Aug. 31, 2004

(54) THERMAL PROCESSING OF METAL ALLOYS FOR AN IMPROVED CMP PROCESS IN INTEGRATED CIRCUIT FABRICATION

(75) Inventors: Paul A. Farrar, So. Burlington, VT (US); John H. Givens, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/945,536

(22) Filed: Aug. 30, 2001

(65) Prior Publication Data

US 2002/0033498 A1 Mar. 21, 2002

Related U.S. Application Data

(63) Continuation of application No. 09/038,252, filed on Mar. 10, 1998, now Pat. No. 6,316,356.

(51) Int. Cl.$^7$ .............................................. H01L 23/49
(52) U.S. Cl. ..................... 257/765; 257/741; 257/742
(58) Field of Search ................................. 438/660, 688, 438/658, 687, 637; 257/742, 765, 762, 314, 324, 741

(56) References Cited

U.S. PATENT DOCUMENTS

| | | | |
|---|---|---|---|
| 3,561,954 A | 2/1971 | Brook | 75/142 |
| 4,393,096 A | 7/1983 | Gajda | 427/90 |
| 4,595,429 A | 6/1986 | Le Caer et al. | 148/403 |
| 5,071,791 A | 12/1991 | Inoue et al. | 437/203 |
| 5,205,770 A | 4/1993 | Lowrey et al. | 445/24 |
| 5,229,316 A | 7/1993 | Lee et al. | 437/67 |
| 5,300,155 A | 4/1994 | Sandhu et al. | 148/33 |
| 5,354,712 A | 10/1994 | Ho et al. | 437/195 |
| 5,395,801 A | 3/1995 | Doan et al. | 437/225 |
| 5,409,563 A | 4/1995 | Cathey | 156/643 |

(List continued on next page.)

FOREIGN PATENT DOCUMENTS

| | | |
|---|---|---|
| GB | 1211563 | 11/1970 |
| JP | 60187654 A | 9/1985 |
| JP | 61159545 A | 7/1986 |
| JP | 63179041 A | 7/1988 |

OTHER PUBLICATIONS

IBM Tech Discl Bull vol. 17 No. 10 pp 2867–2869.*
Kaanta, C., et al., "Dual Damascene: A ULSI Wiring Technology", *VMIC Conference*, 144–152, (Jun. 1991).

(List continued on next page.)

*Primary Examiner*—Caridad M. Everhart
(74) *Attorney, Agent, or Firm*—Schwegman, Lundberg, Woessner & Kluth, P.A.

(57) ABSTRACT

A thermal processing method is described which improves integrated circuit metal polishing and increases conductivity following polish. A method of fabricating a metal layer in an integrated circuit is described which comprises the steps of depositing a layer of metal alloy which contains alloy dopant precipitates, and performing a first anneal of the integrated circuit to drive the alloy dopants into solid solution. The metal is quenched to prevent the alloy dopants from coming out of solution prior to removing excess metal alloy with a polish process. To improve conductivity after polishing, the dopants are allowed to come out of solution. The metal alloy is described as aluminum with alloy dopants of silicon and copper where the first anneal is performed at 400 to 500° C. This process is particularly applicable to fabrication of interconnects formed using a dual damascene process. The integrated circuit is described as any circuit, but can be a memory device such as a DRAM.

27 Claims, 3 Drawing Sheets

U.S. PATENT DOCUMENTS

| | | | |
|---|---|---|---|
| 5,416,045 A | 5/1995 | Kauffman et al. | 437/174 |
| 5,420,069 A | 5/1995 | Joshi et al. | 437/187 |
| 5,497,017 A | 3/1996 | Gonzales | 257/306 |
| 5,527,561 A | 6/1996 | Dobson | 427/383.3 |
| 5,641,545 A | 6/1997 | Sandhu | 427/573 |
| 5,644,166 A | 7/1997 | Honeycutt et al. | 257/754 |
| 5,665,659 A * | 9/1997 | Lee et al. | 438/646 |
| 5,750,439 A * | 5/1998 | Naito | 438/648 |
| 5,789,317 A | 8/1998 | Batra et al. | 438/642 |
| 5,814,557 A | 9/1998 | Venkatraman et al. | 438/622 |
| 5,994,221 A | 11/1999 | Kizilyalli et al. | 438/688 |
| 6,017,144 A | 1/2000 | Guo et al. | 364/468.28 |
| 6,022,808 A * | 2/2000 | Nogami et al. | 438/694 |
| 6,090,710 A | 7/2000 | Andricacos et al. | 438/687 |
| 6,110,829 A * | 8/2000 | Besser et al. | 438/688 |
| 6,139,697 A * | 10/2000 | Chen et al. | 204/192.15 |
| 6,271,591 B1 * | 8/2001 | Dubin et al. | 257/751 |
| 6,468,908 B1 | 10/2002 | Chen et al. | 438/687 |

OTHER PUBLICATIONS

Licata, T., et al., "Dual Damascene AL Wiring for 256M DRAM", *VMIC Conference*, 596–602, (Jun. 1995).

Zolotorevskii, V.S., et al., "The effect of Mg + Si and Mg+ Ge addns. on the structure and mech. properties of Al–Cu alloys after aging at 170 degrees", *Izv. Vyssh. Uchebn. Zaved., Tsvetn. Metall.*, 5, Abstract only, pp. 100–104, (1983).

* cited by examiner

THERMAL PROCESSING OF METAL ALLOYS FOR AN IMPROVED CMP PROCESS IN INTEGRATED CIRCUIT FABRICATION

This application is a Continuation of U.S. application Ser. No. 09/038,252 now U.S. Pat. No. 6,316,356, filed Mar. 10, 1998.

TECHNICAL FIELD OF THE INVENTION

The present invention relates generally to integrated circuits and in particular the present invention relates to thermal processing for an improved CMP process.

BACKGROUND OF THE INVENTION

As the density of semiconductor devices continues to increase, the need for smaller interconnections also increases. Historically, the semiconductor industry has used a subtractive etching process to pattern metal interconnect layers of the semiconductor. This metal processing technique, however, has limitations including poor step coverage, non-planarity, shorts and other fabrication problems. To address these problems, a dual damascene technique has been developed. This process, as explained in "Dual Damascene: A ULSI Wiring Technology", Kaanta et al., 1991 *VMIC Conference,* 144–150 (Jun. 11–12, 1991) and incorporated herein by reference, involves the deposition of a metal into contact vias and conductor trenches which are patterned in the semiconductor. The semiconductor is then subjected to a known CMP (chemically-mechanically polish) process to both planarize the semiconductor and remove excess metal from all but the patterned areas.

The metal layer can be fabricated using known CVD (chemical vapor deposition) or PVD (physical vapor deposition) techniques. The metal interconnects are typically an aluminum alloys containing dopants, such as silicon and copper. These dopants are Si and Cu precipitates which tend to migrate to the grain boundaries of the aluminum during deposition. The precipitates are harder than aluminum. Thus, they are hard to dissolve and remove during the CMP process. The precipitates also contribute to defects in the aluminum, such as scratches, which materialize during the CMP process. These problems are present in all CMP processes, and not limited to removing metal alloys used in a dual damascene process.

For the reasons stated above, and for other reasons stated below which will become apparent to those skilled in the art upon reading and understanding the present specification, there is a need in the art for a process of fabricating metal alloy interconnects in an integrated circuit which improves a CMP process and reduces defects experienced during CMP.

SUMMARY OF THE INVENTION

The above-mentioned problems with integrated circuit fabrication and other problems are addressed by the present invention and which will be understood by reading and studying the following specification. A thermal processing method is described which improves metal polishing and increases conductivity following polish.

In particular, the present invention describes a method of fabricating a metal layer in an integrated circuit. The method comprises the steps of depositing a layer of metal alloy which contains alloy dopant precipitates, performing a first anneal of the integrated circuit to drive the alloy dopants into solid solution, and quenching the integrated circuit to prevent the alloy dopants from coming out of solution. Excess metal alloy is then removed using a polish process, and a second anneal is performed after the excess metal alloy is removed to allow the dopants to come out of solution and increase a conductivity of the metal alloy.

In another embodiment, a method of fabricating a metal layer in an integrated circuit. The method comprises the steps of forming vias and interconnect trenches in the integrated circuit and depositing a layer of metal alloy which contains alloy dopant precipitates on the integrated circuit to fill the vias and interconnect trenches. A first anneal of the integrated circuit at 400 to 500° C. to drive the alloy dopants into solid solution. The integrated circuit is quenched to prevent the alloy dopants from coming out of solution prior to removing excess metal alloy using a chemical-mechanical polish process. A second anneal at 150 to 250° C. allows the dopants to come out of solution and increase a conductivity of the metal alloy.

A method of improving a chemical-mechanical polish (CMP) process in an integrated circuit is described. The method comprises the step of annealing the integrated circuit prior to performing the chemical-mechanical polish process to drive alloy dopants into solid solution.

A memory device is described which comprises an array of memory cells, internal circuitry, and metal contacts and interconnects coupled to the memory array and internal circuitry. The metal contacts and interconnects are formed by annealing the memory at a temperature sufficient to drive alloy dopants into solid solution prior to polishing the memory device to remove portions of a metal layer and form the metal contacts and interconnects.

DETAILED DESCRIPTION OF THE INVENTION

Figure 1A:
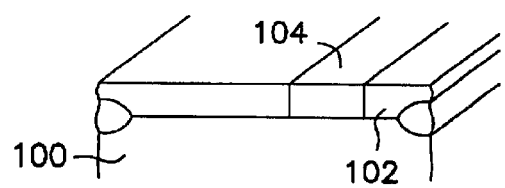
FIGS. 1A–1E are an illustration of a dual damascene fabrication technique according to the present invention.
Figure 1B:
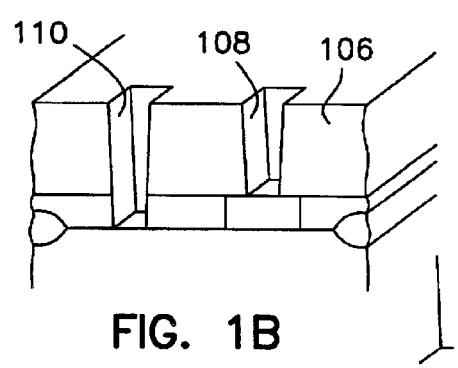
Figure 1D:
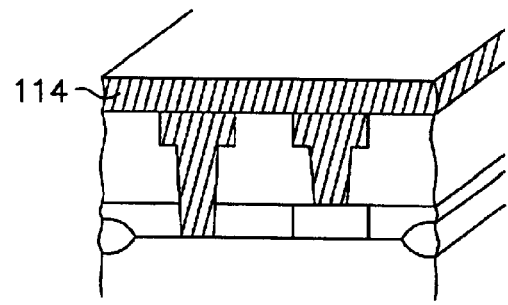
Figure 1C:
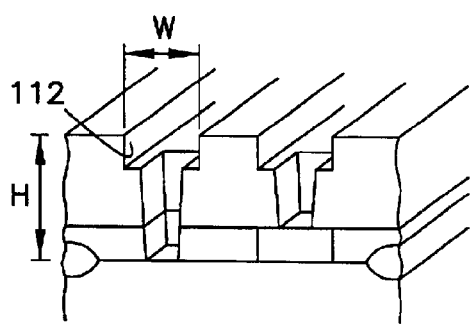
Figure 1E:
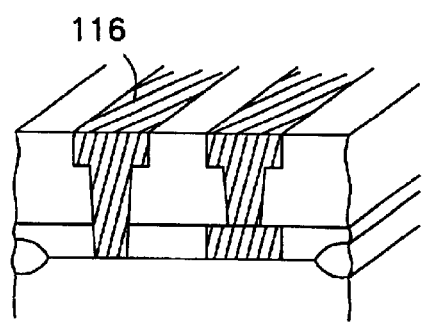

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Prior to describing the process of the present invention, a description of the fabrication of metal conductor and contacts using a dual damascene process is provided. Referring to FIGS. 1A–E, a semiconductor base layer 100 is fabricated with an insulator layer 102, such as an oxide layer. The base layer is typically silicon having regions which are either p-type or n-type doped. A conductive area 104 is provided above the base layer. This conductive region can be any type of conductor or semiconductor, such as polysilicon, metal or doped silicon. A second layer of insulator material 106 is fabricated on top of the first insulator layer. Using known pattern and etch techniques, a contact via 108, or opening, is formed to access conductor area 104. A contact via 110 is also formed to access base layer 100. The vias may be tapered and are intended to provide access to any region or material which is desired to be coupled to a conductor interconnect.

Conductor interconnect trenches 112 are patterned and etched into the dielectric layer 106. After the trenches and access vias are formed, a layer of metal 114 (and necessary barrier metallurgy) is deposited on the device. A physical vapor deposition technique, known to those skilled in the art, is used to fill the features and provide a layer of metal on top of layer 106. As known to those skilled in the art, a CMP process is implemented to remove excess metal from the top surface of the structure and provide defined interconnect lines 116.

In other integrated circuit fabrication processes (i.e., not dual damascene fabrication), the CMP step is provided to polish and planarize the integrated circuit wafer. The present invention improves the CMP process by providing a more uniform metal alloy for polishing.

During the metal deposition process, an aluminum alloy is deposited on the integrated circuit wafer along with dopants, such as copper and silicon. Aluminum has been typically used due to its low resistance and good adhesion to $SiO_2$ and Si. Silicon is usually added as an alloying element to alleviate junction spiking in Al contacts to Si. Further, electromigration and hillocks (spike-like formations) can be reduced by adding Cu, Ti, Pd or Si to aluminum to form alloys. These alloying elements precipitate at the grain boundaries. Thus, the grain boundaries are "plugged" and vacancy migration is inhibited.

The present invention is applicable to any precipitated material, but is particularly applicable to Al—Cu—Si alloys. In particular, Al—Cu, Al—Si and Cu—Si precipitates located at grain boundaries are not easily removed using standard CMP processes. This is primarily due to the hardness of the precipitates. Further, if a relatively large grouping of precipitates are experienced, damage in the form of scratches can occur to the aluminum interconnects during CMP.

Improved Interconnect Fabrication

The present invention provides a uniform metal alloy prior to performing a CMP process. That is, the metal layer is annealed in a conventional 400–500° C. furnace to drive the precipitates dopants back into solution (i.e., a solid state reaction to force the Cu and Si to go back into solution). The wafer is then quenched to prevent formation of precipitate by driving the dopants out of solution. The result is a more uniform alloy material which can be more easily processed using known CMP techniques.

An undesirable side effect of annealing and quenching the alloy is a higher resistance of the interconnect. That is, the dopants are occupying states of the aluminum which causes interference in the flow of electrons across the metal. To reduce the resistance of the metal interconnects, the wafer is thermally soaked (i.e., 150–200° C. anneal) such that the dopants form a second phase and then precipitate out, mainly at the grain boundaries. The reliability of the interconnect metal is also increased by reducing the electron drift which is enhanced by the presence of Si and Cu in solution. The two step thermal process is provided to both enhance the CMP process by providing a uniform alloy prior to CMP, and to improve the reliability and conductivity of the alloy after CMP by driving the dopants out of solution. Although some post-metal deposition annealing has been used in the past, the annealing is performed after a metal etch step to heal any plasma related damage which may be formed during fabrication and to react Al with underlaying layers to improve adhesion and electrical conductivity to underlying structures, not to enhance a subsequent CMP process.

Figure 2:
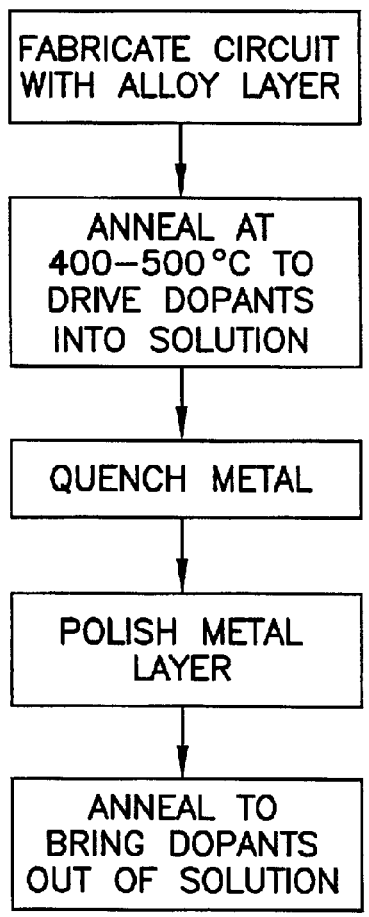
FIG. 2 illustrates the basic process flow of the present metallurgy technique.

While the anneal ranges 400–500° C. and 150–250° C. are intended for aluminum based alloys, the key is to provide a solid state reaction to drive precipitates into solution prior to a polish step. See FIG. 2 for an illustration of the basic process flow of the present metallurgy technique. An integrated circuit is first fabricated with a layer of metal alloy which contains alloy dopant precipitates. The integrated circuit is annealed at 400 to 500° C. to drive the dopants into solid solution. The integrated circuit is then quenched, using any known technique such as quenching in ambient air, to prevent the dopants from coming out of solution. The integrated circuit is then processed to remove excess metal alloy. It is preferred to use a chemical-mechanical polish process to remove the metal. After the circuit has been polished, a second anneal is performed at a lower temperature to allow the dopants to come out of solution. The conductivity of the metal alloy is thereby increased.

Figure 3:
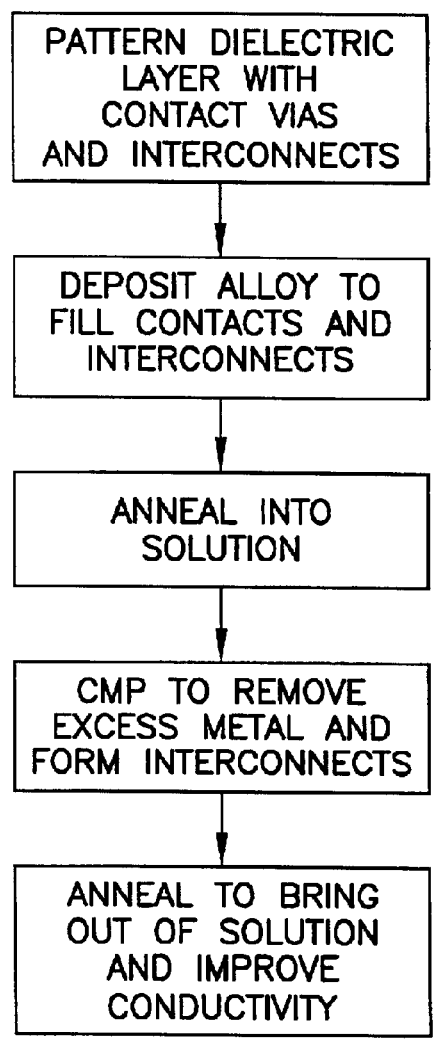
FIG. 3 illustrates in more detail the dual damascene process of the present invention.

FIG. 3 illustrates in more detail the dual damascene process of the present invention. A semiconductor base layer is fabricated with an insulator layer, such as an oxide layer. Using known pattern and etch techniques, contact vias are formed to access to any region or material which is desired to be coupled to a conductor interconnect. Conductor interconnect trenches are also patterned and etched into the dielectric layer. After the trenches and access vias are formed, a layer of metal alloy (and necessary barrier metallurgy) is deposited on the device. The integrated circuit is annealed at 400 to 500° C. to drive the dopants into solid solution. The integrated circuit is then quenched, using any known technique such as quenching in ambient air, to prevent the dopants from coming out of solution. A CMP process is implemented to remove excess metal from the top surface of the structure and provide defined interconnect lines. After the circuit has been polished, a second anneal is performed at a lower temperature to allow the dopants to come out of solution. The conductivity of the metal alloy is thereby increased. It should be noted that the low temperature heat treatment is required to be performed only once. This process should be done after the last high temperature process.

Memory Device

Figure 4:
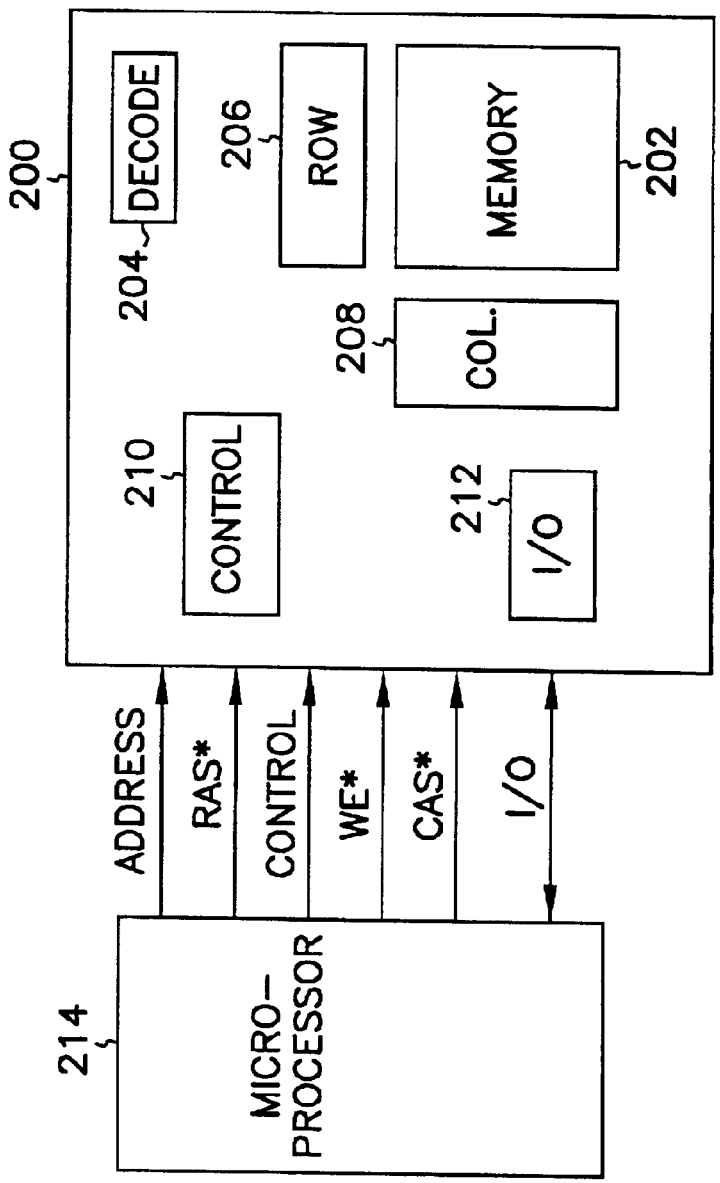
FIG. 4 is a block diagram of a memory device fabricated according to the present invention.

FIG. 4 is a simplified block diagram of a memory device according to one embodiment of the present invention. The memory device 200 includes an array of memory cells 202, address decoder 204, row access circuitry 206, column access circuitry 208, control circuitry 210, and Input/Output circuit 212. The memory can be coupled to an external microprocessor 214, or memory controller for memory accessing. The memory receives control signals from the processor 214, such as WE*, RAS* and CAS* signals. The memory is used to store data which is accessed via I/O lines. It will be appreciated by those skilled in the art that additional circuitry and control signals can be provided, and that the memory device of FIG. 4 has been simplified to help focus on the present invention. Thus, the memory includes internal circuitry and metal contacts and interconnects which are coupled to the memory array and internal circuitry. The metal contacts and interconnects are formed with an alloy of aluminum. The metal contacts and interconnects are formed by annealing the memory at a temperature sufficient to drive alloy dopants into solid solution prior to polishing the memory device to remove portions of a metal layer and form the metal contacts and interconnects. Specifically, a layer of metal alloy is deposited which contains alloy dopant precipitates. A first anneal of the memory is performed to drive the alloy dopants into solid solution. The memory is then quenched to prevent the alloy dopants from coming out of solution prior to removing excess metal alloy using a polish process. A second anneal of the memory is performed after the excess metal alloy is removed to allow the dopants to come out of solution and increase a conductivity of the metal alloy.

It will be understood that the above description of a DRAM is intended to provide a general understanding of the memory and is not a complete description of all the elements and features of a DRAM. Further, the present invention is equally applicable to any size and type of memory circuit and is not intended to be limited to the DRAM described above. Other alternative types of devices include SRAM or Flash memories. Additionally, the DRAM could be a synchronous DRAM commonly referred to as SGRAM, SDRAM, SDRAM II, and DDR SDRAM, as well as Synchlink or Rambus DRAMs.

Conclusion

A thermal processing method has been described which improves metal polishing and increases conductivity following polish. A method of fabricating a metal layer in an integrated circuit has also been described. The method comprises the steps of depositing a layer of metal alloy which contains alloy dopant precipitates, performing a first anneal of the integrated circuit to drive the alloy dopants into solid solution, and quenching the integrated circuit to prevent the alloy dopants from coming out of solution. Excess metal alloy is then removed using a polish process, and a second anneal is performed after the excess metal alloy is removed to allow the dopants to come out of solution and increase a conductivity of the metal alloy. The metal alloy can be aluminum with alloy dopants of silicon and copper where the first anneal is performed at 400 to 500° C. This process is particularly applicable to fabrication of interconnects formed using a dual damascene process. The integrated circuit has been described as any circuit, but can be a memory device such as a DRAM.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:
an array of memory cells;
internal circuitry; and
metal contacts and interconnects coupled to the memory array and internal circuitry, wherein the metal contacts and interconnects are formed by annealing the memory at a temperature sufficient to drive alloy dopants into solid solution and quenching the memory prior to polishing the memory device to remove portions of a metal layer and form the metal contacts and interconnects.

2. The memory device of claim 1 wherein the memory device is annealed following the polishing the memory device to increase a conductivity of the metal contacts and interconnects.

3. memory device comprising:
an array of memory cells;
internal circuitry; and
metal contacts and interconnects coupled to the memory cells and internal circuitry, wherein the metal contacts and interconnects are formed by annealing the memory at a temperature sufficient to drive alloy dopants into solid solution and quenching the memory prior to polishing the memory device to remove portions of a metal layer and form the metal contacts and interconnects.

4. The memory device of claim 3 wherein the memory device is annealed following polishing of the memory device to increase the conductivity of the metal contacts and interconnects.

5. The memory device of claim 3, wherein metal contacts and interconnects comprise aluminum and the alloy dopants include at least one of Cu, Ti, Pd and Si.

6. The memory device of claim 3, wherein the metal contacts and interconnects reside in via trenches formed in an insulating layer atop a substrate.

7. The memory device of claim 3, wherein the metal layer is annealed after polishing so that the alloy dopants come out of solution to increase the conductivity of the metal contacts and interconnects.

8. A memory device, comprising:
an array of memory cells;
internal circuitry;
a system metal alloy contacts and interconnects coupled to the memory cells and internal circuitry, the metal contacts and interconnects comprising a metal alloy layer with alloy dopants residing in contact vias and interconnect trenches formed in an insulating layer atop a substrate; and
wherein the metal alloy layer is annealed a first time to drive the alloy dopants into solid solution, quenched to prevent the alloy dopants from coming out of solution, and annealed a second time after polishing to allow the dopants to come out of solution in order to increase the conductivity of the metal alloy layer.

9. The memory device of claim 8, wherein one or more of the vias are tapered.

10. The memory device of claim 8, wherein the insulating layer comprises oxide.

11. The memory device of claim 8, further including an external microprocessor coupled to the array of memory cells.

12. A memory device, comprising:
an array of memory cells;
internal circuitry;
vias and interconnect trenches formed within an insulating layer atop the substrate and connected to the internal circuitry and array of memory cells; and
a high-conductivity doubly annealed metal alloy formed in the vias and interconnection trenches, wherein the high-conductivity doubly annealed metal alloy includes a metal alloy first annealed for driving alloy dopants into solid solution, quenched for preventing the alloy dopants from coming out of solid solution, polished for planarizing the metal alloy, and second annealed for allowing dopants to come out of solution.

13. The memory device of claim 12, wherein the high-conductivity doubly annealed metal alloy comprises aluminum and at least one of Cu, Ti, Pd and Si as alloy dopants.

14. A memory device comprising:
an array of memory cells;
internal circuitry;
a high-conductivity system of contacts and interconnects coupled to the internal circuitry and array of memory cells, the high-conductivity system comprising:
a layer of insulating material atop a substrate;
vias formed in the insulating material extending down to the substrate at different locations;
interconnect trenches formed in the insulating material, with each interconnect trench connected to at least one via; and
high-conductivity means formed in the vias and interconnect trenches for providing a high-conductivity electrical connection between the different locations on the substrate, wherein the high-conductivity means includes a metal alloy first annealed for driving alloy dopants into solid solution, quenched for preventing the alloy dopants from coming out of solid solution, polished for planarizing the metal alloy, and second annealed for allowing dopants to come out of solution.

15. A memory device comprising:
an array of memory cells;
internal circuitry:
high-conductivity system of contacts and interconnects coupled to the internal circuitry and array of memory cells, the high-conductivity system comprising:
a layer of insulating material atop a substrate:
vias formed in the insulating material extending down to the substrate at different locations;
interconnect trenches formed in the insulating material, with each interconnect trench connected to at least one via; and
high-conductivity means formed in the vias and interconnect trenches for providing a high-conductivity electrical connection between the different locations on the substrate, wherein the high-conductivity means includes a metal alloy first annealed at a first temperature to drive alloy dopants into solid solution to make the metal alloy more polishable, quenched to prevent the alloy dopants from coming out of solid solution, polished to planarize the metal alloy, and then second annealed at a second temperature such that dopants are allowed to come out of solution to increase the conductivity of the metal alloy.

16. The memory device of claim 15, wherein the second anneal temperature is less than the first anneal temperature.

17. A memory device comprising:
an array of memory cells;
internal circuitry;
a substrate base layer with an insulating layer formed thereon;
a layer of aluminum alloy residing in vias and interconnect trenches formed in the insulating layer, the metal alloy layer coupled to the array of memory cells and internal circuitry; and
wherein the layer of aluminum alloy is annealed at a first anneal temperature between 400° C. and 500° C., quenched for preventing alloy dopants from coming out of solid solution, polished for planarizing the layer of aluminum alloy, and annealed at a second anneal temperature less than the first anneal temperature.

18. The memory device of claim 17, wherein the aluminum alloy includes alloy dopants, said alloy dopants including at least one selected from the group of alloy dopants consisting of Cu, Ti, Pd and Si.

19. A memory device comprising:
a system of twice-annealed aluminum alloy interconnects and contacts formed in an insulating layer atop a substrate, wherein a first anneal facilitates polishing of the alloy and a second anneal improves electrical conductivity and adhesion properties of the alloy; and
an array of memory cells and internal circuitry coupled to the system.

20. The memory device of claim 19, wherein the alloy dopants include at least one of Cu, Ti, Pd and Si.

21. The memory device of claim 19, wherein the first anneal is performed at a first anneal temperature in the range of 400° C. to 500° C.

22. The memory device of claim 21, wherein the second anneal is performed at a second anneal temperature in the range of 150° to 250° C.

23. A memory device comprising:
memory means for storing data; and
annealed metal alloy means patterned into a semiconductor substrate and connected to select regions on the semiconductor substrate and to said memory means, wherein the annealed metal alloy means includes a metal alloy first annealed for driving alloy dopants into solid solution, quenched for preventing the alloy dopants from coming out of solid solution, polished for planarizing the metal alloy, and second annealed for allowing dopants to come out of solution.

24. The memory device of claim 23, wherein the annealed metal alloy means includes alloy dopants comprising at least one of Cu, Ti, Pd and Si.

25. The memory device of claim 23, wherein the annealed metal alloy means is patterned into silicon dioxide formed atop the semiconductor substrate.

26. The memory device of claim 23, wherein the metal alloy means is aluminum with alloy dopants of Si and Cu.

27. The memory device of claim 23, further including a microprocessor coupled to the memory means.

* * * * *

UNITED STATES PATENT AND TRADEMARK OFFICE
CERTIFICATE OF CORRECTION

PATENT NO. : 6,784,550 B2
DATED : August 31, 2004
INVENTOR(S) : Farrar et al.

It is certified that error appears in the above-identified patent and that said Letters Patent is hereby corrected as shown below:

Column 7,
Line 46, delete "circuitry:", and insert -- circuitry; --, therefor.
Line 47, insert -- a -- before "high-conductivity".
Line 50, delete "substrate:" and insert -- substrate; --, therefor.

Signed and Sealed this

Tenth Day of May, 2005

JON W. DUDAS
*Director of the United States Patent and Trademark Office*